United States Patent
Peters et al.

(10) Patent No.: US 9,312,200 B1
(45) Date of Patent: Apr. 12, 2016

(54) SOLID STRUCTURES FOR THERMAL MANAGEMENT

(71) Applicant: Amazon Technologies, Inc., Reno, NV (US)

(72) Inventors: David Eric Peters, San Jose, CA (US); Ross Kenneth Thayer, Santa Clara, CA (US); John Avery Howard, Palo Alto, CA (US)

(73) Assignee: Amazon Technologies, Inc., Reno, NV (US)

(*) Notice: Subject to any disclaimer, the term of this patent is extended or adjusted under 35 U.S.C. 154(b) by 306 days.

(21) Appl. No.: 13/801,406

(22) Filed: Mar. 13, 2013

(51) Int. Cl.
*H01L 23/373* (2006.01)
*H05K 7/20* (2006.01)

(52) U.S. Cl.
CPC ......... *H01L 23/3733* (2013.01); *H01L 23/3731* (2013.01); *H01L 23/3736* (2013.01); *H05K 7/2039* (2013.01)

(58) Field of Classification Search
CPC ....... G06F 1/20; G06F 1/203; H01L 23/3731; H01L 23/3735; H01L 23/3736; H01L 23/3737; H01L 23/3738
USPC .......................... 361/679.46–679.54, 688–723
See application file for complete search history.

(56) References Cited

U.S. PATENT DOCUMENTS

| | | | | |
|---|---|---|---|---|
| 4,960,734 A | * | 10/1990 | Kanai et al. | 501/96.4 |
| 6,231,933 B1 | * | 5/2001 | Grant | 427/565 |
| 2002/0001177 A1 | * | 1/2002 | Petitbon | H01L 21/4871 361/690 |
| 2002/0185269 A1 | * | 12/2002 | Sato | 165/185 |
| 2004/0168313 A1 | * | 9/2004 | Magnusson | 29/847 |
| 2007/0128772 A1 | * | 6/2007 | Yonemura et al. | 438/129 |
| 2009/0255660 A1 | * | 10/2009 | Cornie et al. | 165/185 |
| 2011/0182035 A1 | * | 7/2011 | Yajima | 361/717 |

FOREIGN PATENT DOCUMENTS

DE  10339692 A1 * 3/2005 ............. H05K 1/05

* cited by examiner

*Primary Examiner* — Zachary M Pape
(74) *Attorney, Agent, or Firm* — Sutherland Asbill & Brennan LLP

(57) ABSTRACT

Solid structures for thermal management are provided. In one aspect, the solid structures can comprise a metal-ceramic composite member assembled to be in thermal contact with a heat source. The metal-ceramic composite member can be mechanically coupled to an assembly (e.g., an electronic assembly) containing the heat source, and can provide mechanical stability to such assembly. In another aspect, the solid structures can comprise an oxide member that covers a surface of the metal-ceramic composite member, forming a metal-ceramic-oxide interface at the surface. The thickness of the oxide member combined with the magnitude of its thermal conductivity relative to the thermal conductivity of the metal-ceramic composite member can permit heat transport substantially along a direction substantially parallel to the metal-ceramic-oxide interface, and can reduce heat transfer through such interface.

18 Claims, 5 Drawing Sheets

SOLID STRUCTURES FOR THERMAL MANAGEMENT

BACKGROUND

Electronic circuitry in assemblies can dissipate a substantial amount of heat during operations. Such heat dissipation generally is exacerbated in scenarios in which the electronic circuitry is densely packaged. In user equipment, such as a portable electronic device, the device's electronic circuitry can dissipate enough heat to cause elevated temperatures at the housing of the device, causing discomfort to a user of the device, which in turn, can lead to reduced consumer satisfaction with the device.

BRIEF DESCRIPTION OF THE DRAWINGS

The accompanying drawings are an integral part of the disclosure and are incorporated into the subject specification. The drawings illustrate example embodiments of the disclosure and, in conjunction with the description and claims, serve to explain at least in part various principles, features, or aspects of the disclosure. Certain embodiments of the disclosure are described more fully below with reference to the accompanying drawings. However, various aspects of the disclosure can be implemented in many different forms and should not be construed as limited to the implementations set forth herein. Like numbers refer to like elements throughout.

DETAILED DESCRIPTION

Figure 1A:
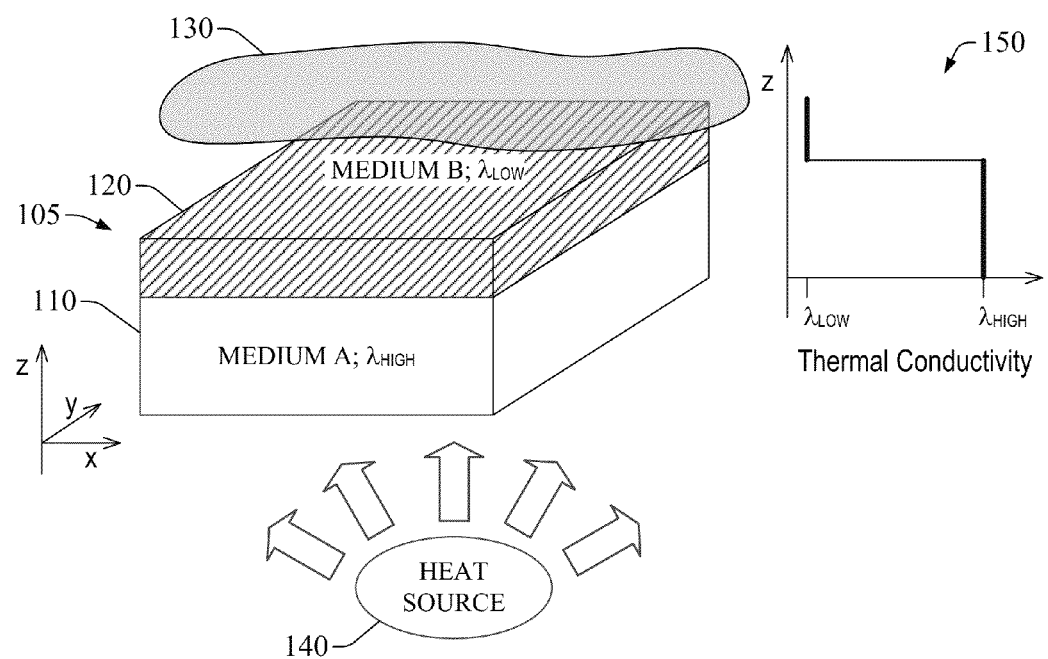
FIG. 1A illustrates an example thermal environment having an example solid structure in accordance with one or more aspects of the disclosure. A sketch of the thermal conductivity of the example structure also is shown.

The disclosure recognizes and addresses, in one aspect, the issue of heat dissipation in electronic circuitry of consumer electronic devices, such as portable electronic devices (also referred to as "portable devices") in which the electronic circuitry is densely packaged. The disclosure provides solid structures for thermal management. To at least such end, in one aspect, the solid structures can comprise a metal-ceramic composite member that can be mechanically coupled to an assembly (e.g., an electronic assembly) and can be assembled to be in thermal contact with a heat source contained in the assembly. The metal-ceramic composite can have a first thermal conductivity and a plurality of surfaces. In certain embodiments, at least one of the plurality of surface can be a substantially planar surface. The metal-ceramic composite member can provide mechanical stability to the assembly. For example, the metal-ceramic composite member can be embodied in or can comprise a spreader plate that can be mechanically coupled to or otherwise contained in the assembly. The assembly can be embodied in an electronic assembly contained in a portable electronic device (e.g., a mobile e-book reader, a smartphone, or other type of mobile tablet). In addition, the heat source can be embodied in or can comprise one or more integrated chipsets contained in the electronic circuitry of the portable electronic device.

The solid structures can comprise a metal oxide member (such as an oxide layer or other type of oxide coating) that coats a surface of the metal-ceramic composite member, forming a metal-ceramic-oxide interface at such surface. In certain embodiments, the metal oxide layer can be assembled to form an interface with the metal-ceramic composite member at the substantially planar surface. The metal oxide member can have one or more thicknesses and can have a second thermal conductivity. In one aspect, the first thermal conductivity of the metal-ceramic composite can be greater than the second thermal conductivity of the metal oxide member. Such relationship between thermal conductivities can permit the solid structures to transport heat from the heat source substantially along a direction substantially parallel to the interface. In certain embodiments, the first thermal conductivity can be about one order of magnitude greater than the second thermal conductivity. As an illustration, the metal oxide member can be embodied in or can comprise an oxide layer having a thickness on the order of 10 μm to permit reduction of heat flow. The thickness of the oxide member combined with the magnitude of its thermal conductivity relative to that of the metal-ceramic matrix can mitigate heat transfer through the metal-ceramic-oxide interface.

In one embodiment, for example, the metal-ceramic composite member comprises an aluminum-ceramic matrix and the metal oxide member comprises alumina, wherein the at least one thickness ranges from about 40 μm to about 60 μm. In such embodiment, the thermal conductivity of the aluminum-ceramic matrix can be about 200 W/m·K, whereas the thermal conductivity of the alumina can range from about 20 W/m·K to about 30 W/m·K. It should also be appreciated that in such embodiment the metal-ceramic member can provide stiffness and light-weight, and in view of such mechanical properties, it can form a suitable spreader plate for shock shielding. In addition, in such embodiment, the aluminum present in the metal-ceramic member (e.g., concentration of aluminum within the ranges from about 0.6 to about 0.8) can provide an aluminum-like thermal conductivity for such composite, which can render the metal-ceramic composite advantageous over spreader plates formed from stainless steel, as the metal-ceramic member can transport heat more efficiently than steel-based spreader plates.

In view of at least the features described herein, it can be appreciated that, in one aspect, the disclosed solid structures for thermal management can embody or can comprise spreader members that (i) have suitable mechanical properties for mechanical stabilization and (ii) can permit efficient management of heat transport. It should also be appreciated that the solid structures of the disclosure can be applied in operational environments other than user equipment. As described in greater detail hereinafter, the disclosed solid structures for thermal management can have various morphologies and can be formed via various treatments of a precursor solid medium. Such treatments can be directed, in one aspect, to heterogeneous structures having a precursor solid medium and a treated solid medium, wherein such solid media have substantially disparate thermal conductivities across a precursor-treated interface. The disparity between the thermal conductivity of the precursor solid media and the thermal conductivity of the treated solid medium can mitigate heat transport (or heat flow) across the precursor-treated interface.

Referring to the drawings, FIG. 1A illustrates an example thermal environment having an example solid structure 105 for thermal management in accordance with one or more aspects of the disclosure. As illustrated, the solid structure comprises a solid medium A 110 that has a thermal conductivity $\lambda_{High}$, which can be position dependent; namely, $\lambda_{High}=\lambda_{High}(R)$ where R=(x,y,z) denotes a position vector within the solid medium A 110. The solid structure 105 also comprises a solid medium B 120 in thermal contact with the solid medium A 110. The solid medium B 120 has a thermal conductivity $\lambda_{Low}=\lambda_{Low}(R)$, where R=(x,y,z) denotes a position vector within the solid medium B 120. In one aspect, the respective thermal conductivities of such media satisfy the relationship $\lambda_{High} \gg \lambda_{Low}$. Diagram 150 sketches such a relationship in a thermal conductivity profile of the solid structure along a direction normal to the planar interface between the solid medium A 110 and the solid medium B 120. As an illustration, in a scenario in which the solid medium A 110 is an electric conductor (e.g., an aluminum rich medium) and the solid medium B 120 is an electric insulator (e.g., alumina), $\lambda_{Low}$ can be about an order of magnitude smaller than $\lambda_{High}$. It should be appreciated that while such interface is illustrated as planar in FIG. 1, atomic mixing and/or other structures (e.g., terraces) at the interface can occur and the thermal conductivity profile sketched in the diagram 150 can present a broadened transition from $\lambda_{High}$ to $\lambda_{Low}$ in the vicinity of the interface.

Figure 1B:
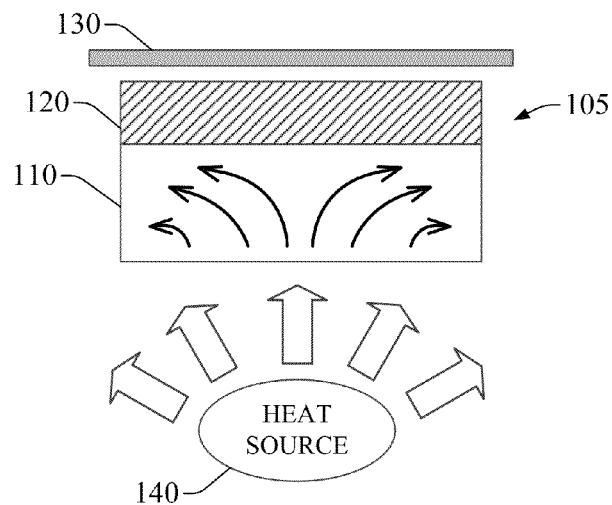
FIG. 1B illustrates a cross section of the example solid structure illustrated in FIG. 1A. A sketch of heat flow, depicted with arrows, in the example solid structure also is presented.

The solid medium A 110 can form a high-thermal conductivity (or high-$\lambda$) member of the solid structure, whereas the solid medium B 120 can form a low-thermal conductivity (or low-$\lambda$) member of the solid structure. Such disparity in thermal conductivities across the interface between the high-$\lambda$ member and the low-$\lambda$ member can permit mitigation of heat transport across such interface. FIG. 1B illustrates such scenario, presenting a cross section of the solid structure 105 and heat flow therein (pictorially represented with arrow). Accordingly, in one aspect, heat emanated from a heat source 140 can be propagated more effectively within a plane substantially parallel to the interface between the solid medium A 110 and the solid medium B 120, whereas heat transport across such interface can be reduced or avoided (depending on the relative magnitude of $\lambda_{High}$ and $\lambda_{Low}$, for example).

Figure 2:
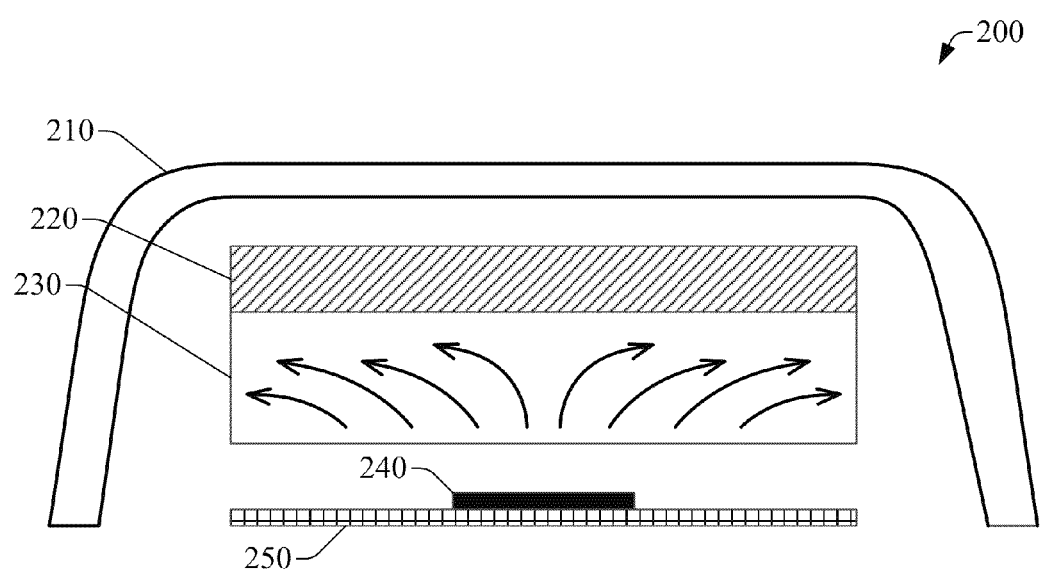
FIG. 2 illustrates an example assembly comprising an example solid structure for thermal management in accordance with one or more aspects of the disclosure.

As an example result, a low-$\lambda$ member having a suitable thickness, e.g., at least about 40 μm, can shield at least a portion of the heat emanated from the heat source 140. In view of such mitigation, an interface member 130 that is part of the operational environment, and is assembled above the solid structure 105, can be exposed to a lesser amount of heat than in scenarios in which the low-$\lambda$ member is absent. As illustrated in the example assembly 200 shown in FIG. 2, the interface member 130 can be embodied in or can comprise a housing 210 of an electronic device, such as user equipment (e.g., a mobile book reader, a tablet, a smartphone, etc.). The electronic device can comprise electronic circuitry that emanates heat. For instance, the electronic circuitry can include a chipset 240 mounted in a printed circuit board 250, wherein the chipset 240 can dissipate heat during operation. The solid structure having a low-$\lambda$ member 220 and a high-$\lambda$ member 230 can mitigate heat flow towards the housing 210, thus mitigating hot spots or other high temperature areas in such housing. Specific designs of the solid structure, such as material choices for the solid medium A 110 and the solid medium B 120, yielding specific relative magnitude of the thermal conductivities of such media can permit thermal management in an environment containing the solid structure 105.

Figure 3:
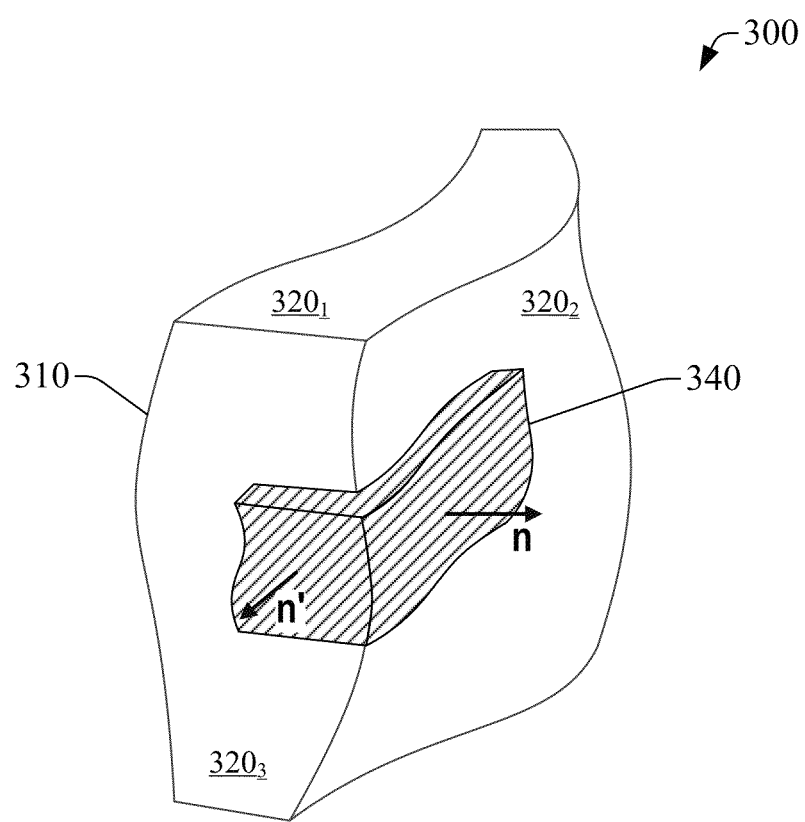
FIG. 3 illustrates another example solid structure for thermal management in accordance with one or more aspects of the disclosure.

A solid structure for thermal management in accordance with aspects of the disclosure can adopt various morphologies. As an example, the example solid structure 300 presented in FIG. 3 can comprise a high-$\lambda$ member 310, e.g., a metallic composite member, assembled to be in thermal contact with a heat source. In one aspect, the high-$\lambda$ member 310 can provide mechanical stability to an assembly (not shown in FIG. 3) comprising the heat source. The example solid structure 300 also can comprise a low-$\lambda$ member 340 (e.g., an oxide member, such as an oxide layer or an oxide coating) that coats or otherwise covers at least a portion of the high-$\lambda$ member 310, thereby forming an interface (e.g., an oxide-composite interface) with the high-$\lambda$ member 310. In one aspect, the low-$\lambda$ member 340 can have at least one thickness and a thermal conductivity suitable to mitigate heat flow from the heat source in a direction substantially normal to the oxide-composite interface, e.g., direction n or direction n'. In certain embodiments, the at least one thickness can range from about 40 μm to about 60 μm. In other embodiments, the at least one thickness can be at least about 40 μm. In addition, in one embodiment, high-$\lambda$ member 310 can have a thermal conductivity that is about one order of magnitude greater than the thermal conductivity of the low-$\lambda$ member 340.

The high-$\lambda$ member 310 can comprise several surfaces, e.g., surface $320_1$, surface $320_2$ and surface $320_3$. In certain embodiments, at least one of the several surfaces can be a substantially planar surface, such as surface $320_3$. In one aspect, such substantially planar surface can contain at least a portion of the formed interface (e.g., the oxide-composite interface). As illustrated, such interface can span more than one surface of the high-$\lambda$ member 310. It should be appreciated that formation of a multi-surface interface can permit thermal management across a variety of interfaces, which may be in thermal contact with component(s) of an assembly, e.g., an electronic device, having varying degrees of tolerance or perceived tolerance (e.g., the tolerance of a consumer) to elevated temperatures.

In one embodiment, for example, the low-$\lambda$ member 340 can comprise a metal oxide, such as one or more of alumina, magnesia, or silica. It should be appreciated that in embodiments in which the high-$\lambda$ member 310 comprises a metallic composite member, such metal oxide can be native or germane to the high-$\lambda$ member 310. For instance, the metallic composite can comprise a metal-ceramic matrix composite (also herein referred to as metal-ceramic matrix) and the metal oxide can be an oxide of the metal contained in the metal-ceramic matrix. In certain embodiments, the metal-ceramic matrix can comprise metal members (e.g., metal fibers or other metal structures) assembled or otherwise incorporated into a ceramic matrix material. In other embodiments, the metal-ceramic matrix can comprise ceramic members (e.g., ceramic fibers or other ceramic structures) assembled or otherwise incorporated into a metal matrix. As an illustration, the metal-ceramic matrix can comprise or can be embodied in an aluminum-ceramic matrix and the metal oxide can comprise or be embodied in alumina. As another illustration, the metal-ceramic matrix can comprise or can be embodied in a magnesium-ceramic matrix, and the metal oxide can comprise magnesia.

Figure 4A:
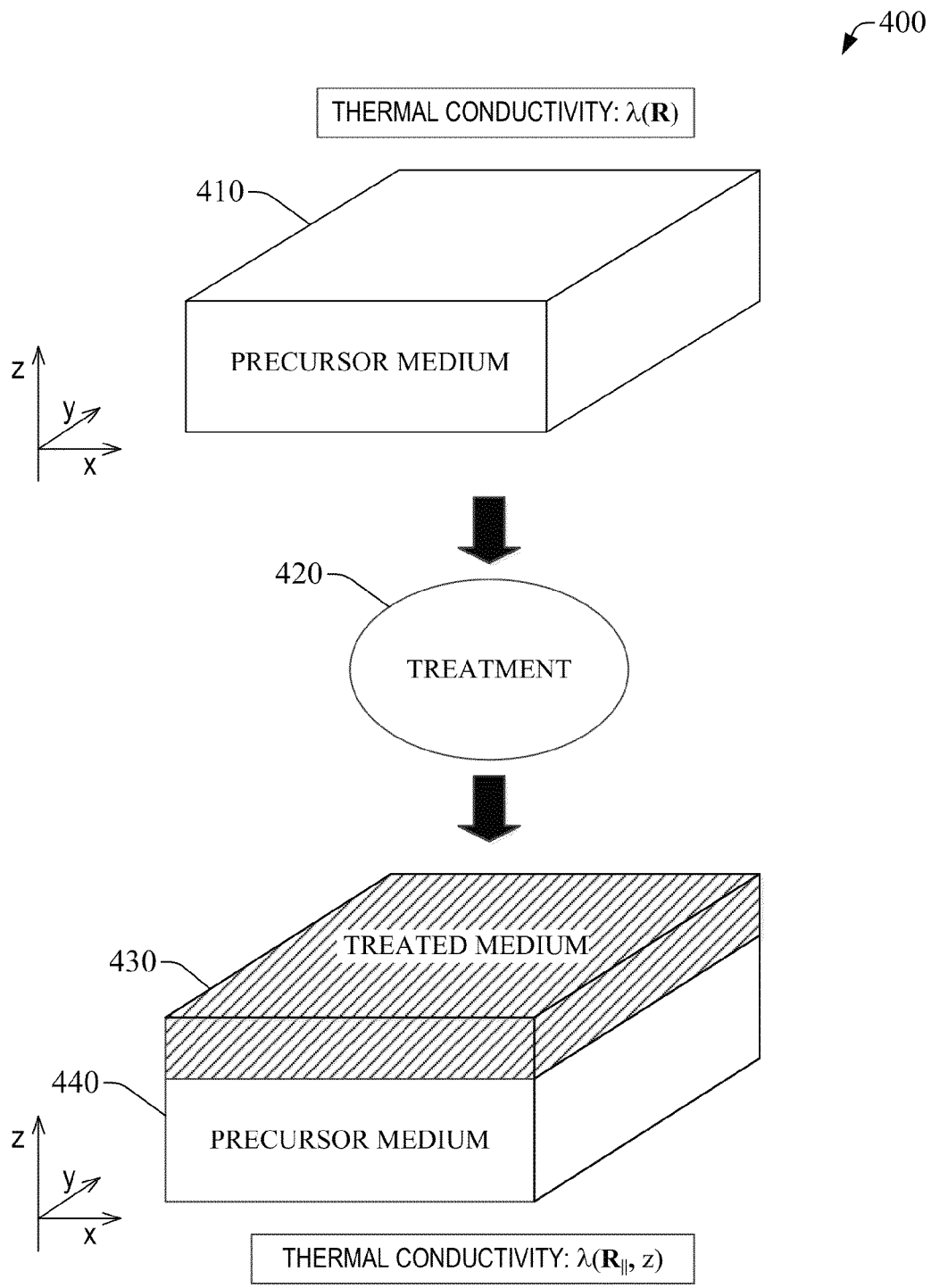
FIGS. 4A-4B illustrate example processes for forming a solid structure in accordance with one or more aspects of the disclosure.

The solid structures for thermal management can be formed according to various treatments of a precursor solid medium, or precursor medium, that can form the high-$\lambda$ member in a solid structure for thermal management. It should be appreciated that selection of a treatment can be selected based at least in part on complexity factors, cost benefit of the treatment, expected or desired performance (e.g., heat flow mitigation, durability, and so forth) of a resulting solid structure for thermal management. As illustrated in FIG. 4A, the precursor medium 410 having a thermal conductivity λ(R) can be submitted to a treatment 420 that can yield a solid structure having at least a portion of the precursor medium 440 and a treated solid medium, or treated medium, that can form the low-λ member. In response to the treatment, the thermal conductivity $\lambda(R\|,z)$ of the solid structure can be rendered non-isotropic, having difference values at least across an interface between the precursor medium and the treated medium. Here, R|| denotes a vector position in the x-y plane of the solid structure, and z denotes a coordinate along an axis normal to such interface. In certain embodiments, the treatment 420 can comprise gaseous deposition of an oxide onto at least the portion of the precursor medium (e.g., a metallic composite medium or metallic composite member). The gaseous deposition can be specific to the oxide that is deposited as part of the treatment and can comprise one or more of sputtering, chemical vapor deposition, metal organic chemical deposition, or molecular beam epitaxy. In such scenarios, the treated medium is non-native to the precursor medium 410 in that the oxide is incorporated into the precursor medium 410 rather than formed from such medium. Such treatments can offer increased versatility for design of specific ratios of thermal conductivity (e.g., $\lambda_{High}/\lambda_{Low}$) in the treated medium with respect to the non-treated medium (e.g., a precursor medium). In addition or in the alternative, such treatments can permit substantive control of the thickness of the treated medium 430, which can control mitigation of heat flow across the interface between the precursor material and the treated medium.

Figure 4B:
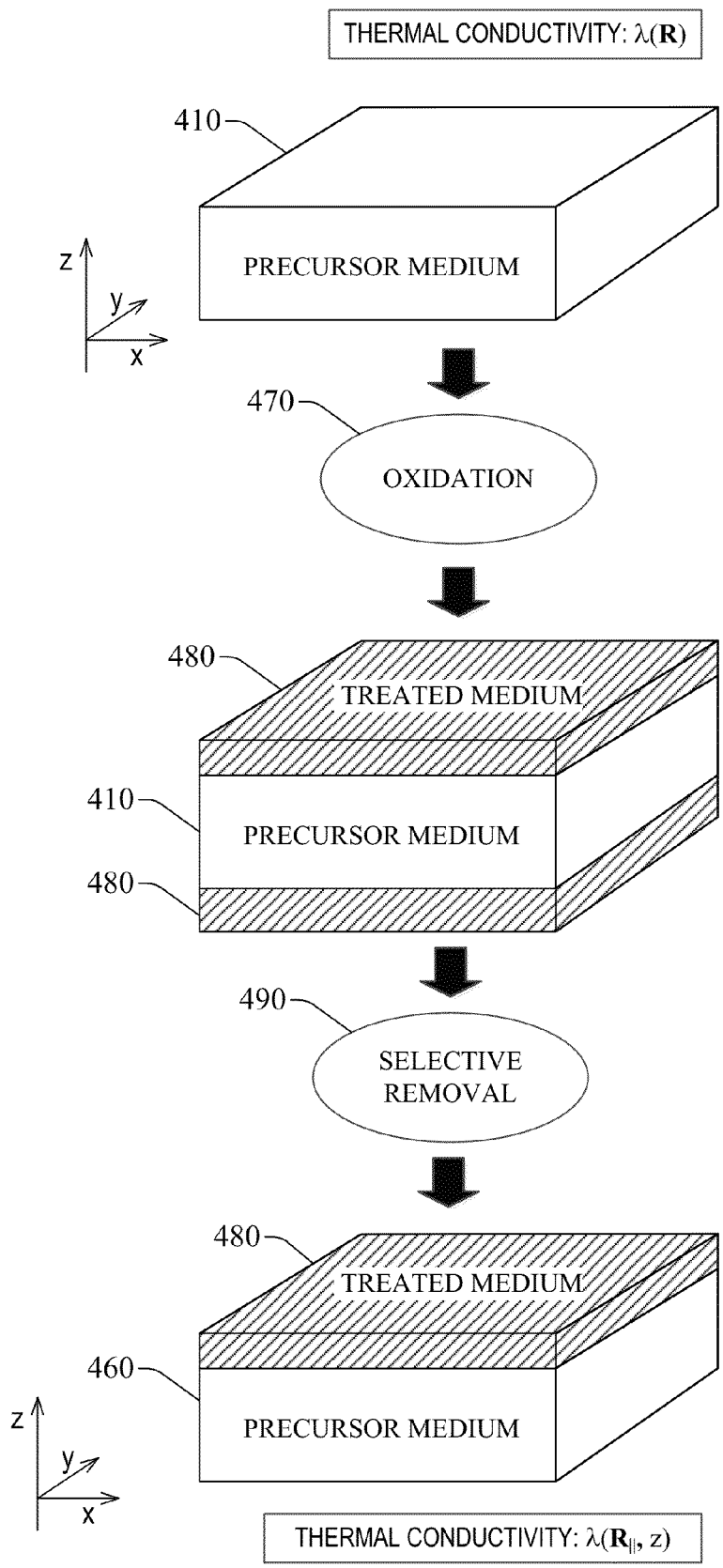

In other embodiments, the treatment 420 can comprise more than one stage of treatment. As illustrated in FIG. 4B, the treatment 420 can comprise an oxidation stage 470 (or oxidation 470) of at least a portion of the precursor medium 410 (e.g., a metallic composite member) that can yield an intermediate solid structure having at least two treated media 480 coating or otherwise covering the precursor medium 410. In addition, the treatment can include a selective removal stage 490 (or selective removal 490) that permits exposing at least one surface of the precursor medium 410 by removing one of the at least two treated media 480. As described herein, such exposure of the precursor medium 410 can permit heat spreading in a direction substantially parallel to the interface between the precursor medium 410 and the remaining treated medium 480 (see also FIG. 2, for example). The selective removal stage can include, for example, chemical etching, mechanical peeling, polishing, combinations thereof, or the like. In certain embodiments, the oxidation 470 can be selective and can comprise one or more of standard anodization, hard anodization, or plasma electrolytic oxidation. In anodization, the precursor medium 410 can be inserted into an electrolytic solution (e.g., chromic acid, sulfuric acid, and the like) and can be configured as the anode of an electric circuit that permits circulation of an electric current through the electrolytic solution. The electric circuit includes a cathode at which hydrogen from the solution is released in response to the electronic current. A voltage difference (or electric potential difference) applied to the anode and cathode causes the electric current to circulate through the electrolytic solution. In addition, in response to the electric current, oxygen from the solution is released at the surface of the anode, and thus, the precursor medium 460 is oxidized. The magnitude of the electric current, temperature of the electrolytic solution, concentration of electrolytes, and acidity of the electrolytic solution, among other factors, can control the rate of oxidation and the resulting thickness of an oxide layer that can be formed. Hard anodization can be achieved, for example, with sulfuric acid as the electrolytic solution and can yield an oxide thickness of at least about 25 µm. In plasma electrolytic oxidation, similarly to anodization, the precursor medium 410 also is inserted into an electrolytic solution and configured or otherwise assembled to be the anode of an electric circuit having a cathode. Yet, in plasma electrolytic oxidation, the electric potentials applied to the anode and cathode result in larger voltage differences than those present in anodization. Larger voltage differences can result in discharges at the oxide layer that are grown at the precursor medium 410 due to electric potentials at the anode that surpass the dielectric breakdown potential of the oxide that is being formed. In response to the discharges, the oxide that is being formed can melt and resolidify, sinterize, a combination thereof, or the like, which can result in a less amorphous or partially crystalline oxide layer.

It should be appreciated that the oxidation 470 can form a native oxide in the precursor medium 460 in scenario in which such medium is a metallic composite. In one aspect, while the treatment illustrated in FIG. 4B and described herein is a multi-stage treatment, it can reduce costs of formation of a solid structure for thermal management in spite of the additional stages of treatment.

It should be appreciated that, in certain embodiments, a precursor medium that is treated to form a solid structure for thermal management can be embodied or can comprise a shock spreader plate, which typically is manufactured of a solid material suitable to be a structural component of an assembly, such as an electronic assembly or a mechanical assembly. As described herein, treatment of the shock spreader plate that is embodied in or can comprise a metal-ceramic composite, such as an aluminum-ceramic composite, can yield a solid structure that can provide mechanical stability to an electronic assembly (e.g., a portable electronic device or wearable electronic device) and can permit reduction of heat flow (e.g., transport of thermal energy) to certain portions of the assembly (e.g., housing of the portable electronic device or wearable electronic device).

In view of the aspects described herein, an example method for thermal management according to one or more aspects of the disclosure can comprise providing a high-λ member (e.g., a metallic composite member) within an assembly. In one embodiment, providing the high-λ member can comprise providing a metal-ceramic matrix, such as an aluminum-ceramic matrix or a magnesium-ceramic matrix, having a thermal conductivity that can be nearly one order of magnitude greater than the thermal conductivity of a metal oxide formed from the metal-ceramic matrix. As described herein, the assembly can be an electronic assembly or a mechanical assembly, and can be embodied in or can comprise user equipment. In one aspect, the high-λ member (e.g., the metallic composite member) can be assembled to be in thermal contact with a heat source within the assembly (e.g., an electronic assembly). To at least such end, in one aspect, the high-λ member (e.g., the metallic composite member) can be mechanically coupled to a housing of the assembly.

In addition, the example method can comprise covering at least a portion of a surface of the high-λ member with a low-λ member (e.g., an oxide member). In certain embodiments, covering at least the portion of the surface of the metallic composite member with the oxide layer having the second thermal conductivity comprises forming an oxide coating having a thickness in the range from about 40 µm to about 60 µm. In one aspect, forming the oxide coating comprises forming one or more of an alumina layer, a magnesia layer, a silica layer, or a metal oxide layer (such as titanium oxide). In other embodiments, such covering can comprise forming the low-λ member (e.g., the oxide member) by treating at least the portion of the surface of the high-λ member. In one aspect, treating at least the portion of the high-λ member can comprise forming an interface between the low-λ member and the high-λ member (e.g., an oxide-composite interface between the oxide member and the metallic composite member). In another aspect, treating at least a portion of a surface of the high-λ member can comprise oxidizing the at least one surface of the high-λ member via one or more of anodization or plasma electrolytic oxidation.

In certain implementations, treating at least the portion of the surface of the high-λ member can comprise forming an oxide layer (which can embody or can comprise low-λ member) covering at least the portion of the surface of the high-λ member. In one aspect, forming the oxide layer can include forming an oxide-member interface between the oxide layer and the high-λ member. In one implementation, the oxide-member interface can be contained within the at least one surface of the high-λ member (e.g., the metallic composite member). The oxide layer can have a thermal conductivity that is lower than the thermal conductivity of the high-λ member. The low-λ member can have at least one thickness and a thermal conductivity suitable to reduce heat flow in the direction substantially normal to the oxide-member interface (see, e.g., FIG. 2). In certain embodiments, the at least one thickness can range from about 40 µm to about 60 µm, and the thermal conductivity of the low-λ member can be nearly one order of magnitude less than the thermal conductivity of a metal-ceramic matrix contained in the high-λ member.

Various example advantages over conventional techniques for thermal management in devices emerge from the description herein and annexed drawings. One example advantage may be that aluminum or an aluminum-based metal-ceramic matrix is utilized in the device and related manufacturing flow. Another advantage may be that aluminum has thermal conductivity that is second only to copper in metals and vastly improved over stainless steel stiffening components. Accordingly, utilization of aluminum or aluminum-based metal-ceramic matrices offers improved heat transport features. Yet another advantage may be that formation of alumina from aluminum can be readily achieved through standard anodization or micro arc oxidation techniques. Still another advantage may be that the thickness of an alumina film typically is less than the thicknesses of certain secondary heat barrier films that can be applied and assembled into a spreader plate. Thus utilization of alumina and aluminum-based high-λ materials may permit reducing thickness of user equipment that utilizes the disclosed solid structures.

Unless otherwise expressly stated, it is in no way intended that any protocol, procedure, process, or method set forth herein be construed as requiring that its acts or steps be performed in a specific order. Accordingly, where a process or method claim does not actually recite an order to be followed by its acts or steps or it is not otherwise specifically recited in the claims or descriptions of the subject disclosure that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification or annexed drawings, or the like.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

What has been described herein in the present specification and annexed drawings includes examples of techniques (e.g., compounds, materials, systems, processes, combination thereof, and the like) that can provide the solid structures of the disclosure. It is, of course, not possible to describe every conceivable combination of elements and/or methodologies for purposes of describing the various features of the disclosure, but one of ordinary skill in the art can recognize that many further combinations and permutations of the claimed subject matter are possible. Accordingly, it may be apparent that various modifications can be made to the disclosure without departing from the scope or spirit thereof. In addition or in the alternative, other embodiments of the disclosure may be apparent from consideration of the specification and annexed drawings, and practice of the disclosure as presented herein. It is intended that the examples put forward in the specification and annexed drawings be considered, in all respects, as illustrative and not restrictive. Although specific terms are employed herein, they are used in a generic and descriptive sense only and not for purposes of limitation.

What is claimed is:

1. A solid structure for thermal management, comprising:
   a metal-ceramic composite member comprising a spreader plate coupled to a housing of an electronic assembly and assembled to be in thermal contact with a heat source contained in the electronic assembly, the metal-ceramic composite member has a substantially planar surface and a first thermal conductivity, wherein the substantially planar surface extends entirely from a first edge of the metal-ceramic composite member to a second edge, opposite the first edge, of the metal-ceramic composite member, and wherein the substantially planar surface further extends entirely from a third edge of the metal-ceramic composite member to a fourth edge, opposite the third edge, of the metal-ceramic composite member; and
   a metal oxide layer assembled to form an interface with the metal-ceramic composite member at the substantially planar surface and having a second thermal conductivity,
   the first thermal conductivity is greater than the second thermal conductivity, whereby the solid structure transports heat from the heat source substantially along a direction substantially parallel to the interface.

2. The solid structure of claim 1, wherein the first thermal conductivity is at least about ten times greater than the second thermal conductivity.

3. The solid structure of claim 1, wherein the metal-ceramic composite member comprises an aluminum-ceramic matrix, and the metal oxide member comprises alumina and has a substantially uniform layer thickness in a range from about 40 µm to about 60 µm.

4. A solid structure for thermal management, comprising:
   a metallic composite member comprising a spreader plate and having a first thermal conductivity, wherein the metallic composite member is assembled to be in thermal contact with a heat source, and wherein the metallic composite member has a planar surface extending entirely from a first edge of the metallic composite member to a second edge, opposite the first edge, of the metallic composite member, the planar surface further extending entirely from a third edge of the metallic composite member to a fourth edge, opposite the third edge, of the metallic ceramic composite member, and further wherein the metallic composite member comprises a metal-ceramic matrix mechanically coupled to a housing of an electronic assembly containing the heat source; and an oxide member having a second thermal conductivity and assembled to form an oxide-composite interface with the metallic composite member at the planar surface, the first thermal conductivity is greater than the second thermal conductivity, whereby the solid structure transports heat from the heat source substantially along the oxide-composite interface.

5. The solid structure of claim 4, wherein the metallic composite member comprises a plurality of surfaces.

6. The solid structure of claim 4, wherein the oxide member is formed via oxidation of at least the portion of the metallic composite member, and wherein the oxidation comprises one or more of standard anodization, hard anodization, or plasma electrolytic oxidation.

7. The solid structure of claim 4, wherein the oxide member is formed via gaseous deposition of an oxide onto at least the portion of the metallic composite member, wherein the gaseous deposition comprises one or more of sputtering, chemical vapor deposition, metal organic chemical deposition, or molecular beam epitaxy.

8. The solid structure of claim 4, wherein the oxide member has at least one thickness in the range from about 40 µm to about 60 µm.

9. The solid structure of claim 4, wherein the first thermal conductivity is about ten times greater than the second thermal conductivity.

10. The solid structure of claim 4, wherein the oxide member comprises a metal oxide.

11. The solid structure of claim 4, wherein the oxide member comprises one or more of alumina, magnesia, titania, or silica.

12. The solid structure of claim 4, wherein the metal-ceramic matrix comprises one or more of an aluminum-ceramic matrix or a magnesium-ceramic matrix.

13. A method of thermal management, comprising:
providing a metallic composite member comprising a spreader plate and having a first thermal conductivity, wherein the metallic composite member has a planar surface extending entirely from a first edge of the metallic composite member to a second edge, opposite the first edge, of the metallic composite member, the planar surface further extending entirely from a third edge of the metallic composite member to a fourth edge, opposite the third edge, of the metallic composite member;

assembling the metallic composite member to be in thermal contact with a heat source within an electronic assembly, wherein the assembling comprises mechanically coupling the metallic composite member to a housing of the electronic assembly; and covering at least a portion of the planar surface of the metallic composite member with an oxide layer having a second thermal conductivity, the covering comprising forming an oxide-composite interface between the oxide layer and the metallic composite member at the planar surface, wherein the first thermal conductivity is greater than the second thermal conductivity.

14. The method of claim 13, wherein forming the oxide-composite interface between the oxide member and the metallic composite member comprises oxidizing at least the portion of the planar surface of the metallic composite member via anodization or plasma electrolytic oxidation.

15. The method of claim 13, wherein covering at least the portion of the planar surface of the metallic composite member with the oxide layer having the second thermal conductivity comprises forming an oxide coating having a thickness in the range from about 40 µm to about 60 µm.

16. The method of claim 15, wherein forming the oxide coating comprises forming one or more of an alumina layer, a magnesia layer, a silica layer, or a metal oxide layer.

17. The method of claim 13, wherein providing the metallic composite member having the first thermal conductivity comprises providing a metal-ceramic matrix having a thermal conductivity that is nearly ten times greater than the second thermal conductivity.

18. The method of claim 17, wherein providing the metal-ceramic matrix comprises providing an aluminum-ceramic matrix or a magnesium-ceramic matrix.

* * * * *